(12) United States Patent
Inaba et al.

(10) Patent No.: US 7,704,416 B2
(45) Date of Patent: Apr. 27, 2010

(54) CONDUCTOR PASTE FOR CERAMIC SUBSTRATE AND ELECTRIC CIRCUIT

(75) Inventors: Akira Inaba, Ryugasaki (JP); Naoto Nakajima, Utsunomiya (JP)

(73) Assignee: E.I. du Pont de Nemours and Company, Wilmington, DE (US)

( * ) Notice: Subject to any disclaimer, the term of this patent is extended or adjusted under 35 U.S.C. 154(b) by 522 days.

(21) Appl. No.: 11/824,194

(22) Filed: Jun. 29, 2007

(65) Prior Publication Data

US 2009/0004369 A1 Jan. 1, 2009

(51) Int. Cl.
*H01B 1/22* (2006.01)
*B05D 5/12* (2006.01)
*C04B 41/88* (2006.01)
*H01L 23/15* (2006.01)
*C03C 8/02* (2006.01)

(52) U.S. Cl. .................. 252/514; 106/1.21; 427/96.1
(58) Field of Classification Search .................. 252/514; 106/1.21; 427/96.1
See application file for complete search history.

(56) References Cited

U.S. PATENT DOCUMENTS

| 3,413,240 A | 11/1968 | Short | |
| 4,318,830 A * | 3/1982 | Horowitz | 252/514 |
| 5,922,627 A * | 7/1999 | Nabatian et al. | 501/17 |
| 6,136,230 A * | 10/2000 | Sanada | 252/518.1 |
| 2004/0245508 A1 | 12/2004 | Wang et al. | |
| 2008/0230119 A1* | 9/2008 | Akimoto | 136/255 |
| 2009/0066193 A1* | 3/2009 | Glicksman et al. | 310/363 |

FOREIGN PATENT DOCUMENTS

| GB | 1151797 | | 5/1969 |
| JP | 04174597 A | * | 6/1992 |
| JP | 10-340622 | | 12/1998 |
| JP | 2006-313744 A | * | 11/2006 |

OTHER PUBLICATIONS

PCT International Search Report and Written Opinion for International Application No. PCT/US2008/068459 dated Oct. 2, 2008.

* cited by examiner

*Primary Examiner*—Mark Kopec

(57) ABSTRACT

A conductor paste for a ceramic substrate contains a) a conductive metal powder comprising a silver powder and a palladium powder; b) a glass powder; and c) an organic solvent, wherein the conductive metal powder has an average particle diameter of not more than 1.2 μm, and the glass powder is a $Bi_2O_3$—$SiO_2$—$B_2O_3$ type glass powder, and the content of the glass powder is in a range of from 1 to 6 wt % based on the weight of the paste.

9 Claims, 1 Drawing Sheet

CONDUCTOR PASTE FOR CERAMIC SUBSTRATE AND ELECTRIC CIRCUIT

BACKGROUND OF THE INVENTION

1. Field of the Invention

The present invention relates to a conductor paste used for forming circuitry on a ceramic substrate, and a circuit substrate having electric circuit formed thereon using the conductor paste.

2. Technical Background

Circuit substrates made of a ceramic, such as alumina ($Al_2O_3$) or aluminum nitride (AlN), are commonly used as circuit substrates for various electronic components.

As one of the methods for forming the circuit (a conductor layer) on such as a ceramic substrate, a conductor paste is used to form the electric circuit though the process of screen printing, drying and firing.

The conductor paste is generally one in which a conductive powder and a glass powder are dispersed in an organic medium. For example, in JP-A-10-340622, there is disclosed a conductor paste in which a conductive powder comprises silver and palladium, a glass powder has an average particle diameter of not more than 1.5 μm and a softening point in a range of from 750 to 900° C., and a silicon dioxide powder has an average particle diameter of not more than 0.1 μm are dispersed in an organic vehicle.

In US 2004-0245508, there is disclosed a conductor paste for an aluminum nitride substrate comprising a boron-containing compound and a metal oxide, this structure being designed to increase adhesive strength.

Meanwhile, in recent years, to reduce environmental impact, disuse of lead and of cadmium has been encouraged. Also, to keep down manufacturing cost, it is desirable to reduce the firing temperature (to not more than 650° C.). Note that the firing temperature to form a conductor film on a ceramic substrate has generally been approximately 850° C.

Retaining adhesion is important. It is not enough only to use glass frits having low softening points in the paste to promote good adhesion where the firing temperature is lower than 650° C. One problem that may occur at such low temperatures is that sintering may be deficient and strong bonds may not occur, limiting adhesion.

It is an object of the present invention to provide a conductor paste that is lead-free and cadmium-free, can be fired at a low temperature of not more than 650° C., and has excellent adhesive strength on a ceramic substrate. Further, it is an object of the present invention to provide an electric circuit substrate in which the adhesive strength between a ceramic substrate and a conductor film is adequate.

BRIEF SUMMARY OF THE INVENTION

One embodiment of the present invention is a conductor paste for a ceramic substrate comprising a) a conductive metal powder selected from the group consisting of silver, palladium and a mixture of silver and palladium; b) a glass powder; and c) an organic solvent, wherein the conductive metal powder has an average particle diameter of not more than 1.2 μm, and the glass powder is a $Bi_2O_3$—$SiO_2$—$B_2O_3$ type glass powder, and a content of the glass powder is in a range of from 1 to 6 wt % based on the weight of the paste.

Another aspect of the present invention is as a conductor film formation method containing the following steps: a step of applying onto a ceramic substrate a conductor paste comprising a) a conductive metal powder selected from the group consisting of silver, palladium and a mixture thereof, b) a glass powder, and c) an organic solvent, in which the conductive metal powder has an average particle diameter of not more than 1.2 μm, and the glass powder is a $Bi_2O_3$—$SiO_2$—$B_2O_3$ type glass powder, and the content of the glass powder is in a range of from 1 to 6 wt % based on the weight of the paste; and wherein the process has a step of firing the conductor paste that has been applied onto the ceramic substrate at not more than 650° C.

Yet another aspect of the present invention is an electric circuit substrate having a circuit comprising a conductor film obtained using the above conductor film formation method.

According to the present invention, there is provided an electric circuit substrate in which the adhesive strength between a ceramic substrate and a conductor film is excellent.

DETAILED DESCRIPTION OF THE INVENTION

Figure 1A:
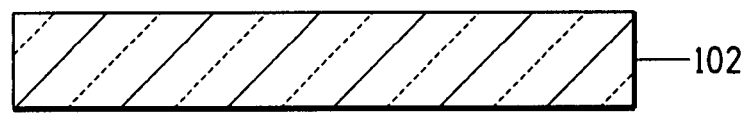
FIG. 1 consists of schematic view for explaining a method of forming a conductor film of the present invention.

Bonding between a ceramic substrate and a conductor film fired at low temperature may be insufficient. This may occur for several reasons. For example, at low temperature, sintering of Ag powder does not proceed sufficiently and strong bonds may not be formed between the glass layer in a conductor film and the ceramic substrate. The present invention has been found to avoid these problems.

The paste of the present invention comprises a) a conductive metal powder, b) a glass powder, and c) an organic solvent.

a) Conductive Metal Powder

The conductive metal powder herein contains silver or palladium or a mixture thereof. Preferably, the conductive metal powder comprises at least a mixture of a silver powder and a palladium powder, a silver/palladium co-precipitated powder, or a silver-palladium alloy powder. Two or more of these may also be used in combination. Moreover, a silver/palladium co-precipitated powder or silver-palladium alloy powder may be mixed with a silver powder. Examples of a co-precipitated powder are (1) one in which silver particles and palladium particles are aggregated together, and (2) one in which a double layer is formed with either silver or palladium being the core. An example of a method of manufacturing a co-precipitated powder of (1) is a method in which an aqueous solution of a silver salt and a palladium salt are reduced together so as to produce a silver powder and palladium powder of diameter approximately from 0.02 to 0.06 μm, and these fine powders are aggregated together in a predetermined compositional ratio, thus forming particles of apparent diameter not less than 0.1 μm. An example of a method of manufacturing a co-precipitated powder of (2) is a method in which the silver is first reduced to produce particles, and then the palladium is reduced, so as to precipitate palladium on the surface of the silver particles, and thus form a double layer with silver as the core.

The palladium content is preferably from 0.1 to 7 wt % relative to a total amount of silver and palladium of 100 wt %. Through the palladium content being within this range, adhesion strength between a ceramic substrate and a conductor film is improved.

The average particle diameter of the conductive metal powder is not more than 1.2 μm. By using a conductive metal powder having an average particle diameter of not more than 1.2 μm, sintering of conductive metal powder proceeds even at a low temperature and the adhesive strength between the conductor film and the ceramic substrate is improved. The average particle diameter of the conductive metal powder is preferably from 0.05 to 1.2 μm, more preferably from 0.05 to 0.8 μm.

As the method of measuring the average particle diameter, measurement is carried out using a Microtrac particle size distribution measurement apparatus, the $D_{50}$ value is taken as the average particle diameter.

Any of various shapes, such as spheres or flakes, can be used as the shape of the conductive metal powder.

The conductive metal powder preferably comprises monodispersed particles. A fine particle powder has a high surface activity, and hence exists as an aggregate. "Monodispersed particles" means particles for which, upon applying mechanical force to this aggregate by a disperser such as a triple roll mill, a ball mill or a bead mill, the aggregate is broken up into primary particles, which can be dispersed uniformly in a vehicle (organic medium). Conversely, the case where the agglomeration strength between the fine particles is too strong so that dispersion into primary particles is not possible even upon applying such mechanical force is not referred to as "monodispersed particles". By using monodispersed particles in the paste, the packing density of the dried film can be increased, and the contact area between particles can be increased, and hence the sintered density upon firing can be increased.

In addition to the above conductive metal powder contained as an essential component, other conductive metal powder may be contained. For example, gold or platinum may be included as a supplementary conductive metal powder. The amount included in the case of adding gold or platinum is preferably in a range of from 0.1 to 10 wt % where the paste has a weight of 100 wt %.

The content of the conductive metal powder is preferably in a range of from 60 to 92 wt % where the paste has a weight of 100 wt %.

b) Glass Powder

A $Bi_2O_3$—$SiO_2$—$B_2O_3$ type glass powder is used as the glass powder. "$Bi_2O_3$—$SiO_2$—$B_2O_3$ type glass powder" means a glass containing at least $Bi_2O_3$, $SiO_2$ and $B_2O_3$ as composition thereof.

The content of bismuth oxide ($Bi_2O_3$) is preferably from 65 to 90 wt % based on the weight of the glass powder, and the content of silicon oxide ($SiO_2$) is preferably from 0.5 to 8 wt % based on the weight of the glass powder. Moreover, the content of boron oxide ($B_2O_3$) is preferably from 3 to 10 wt % based on the weight of the glass powder.

Other components may be contained as required. Examples of such other components include ZnO, $Al_2O_3$, $La_2O_3$, $TiO_2$, $ZrO_2$, $SnO_2$, $CeO_2$, MgO, CaO, SrO, BaO, $Li_2O$, $Na_2O$, and $K_2O$.

The glass powder in the paste may also be mixed with two or more type of glass powders used in-combination. In this case, from the view point of the adhesive strength between the ceramic substrate and the conductor film, of the glass powders contained, preferably not less than 50 wt %, more preferably not less than 80 wt %, yet more preferably not less than 90 wt %, most preferably 100 wt %, is the $Bi_2O_3$—$SiO_2$—$B_2O_3$ type glass powder.

The transition point and softening point of the glass powder are preferably low so that firing at low temperature can be accomplished. Specifically, the transition point of the glass powder is preferably from 360 to 450° C. The softening point of the glass is preferably from 400 to 530° C.

The following $Bi_2O_3$—$SiO_2$—$B_2O_3$ glass powder is a specific example of the composition of the glass powder. Note, however, that the glass powder used in the present invention is not limited to being such a $Bi_2O_3$—$SiO_2$—$B_2O_3$ glass powder.

$Bi_2O_3$: 65 to 90 wt %
$SiO_2$: 0.5 to 8 wt %
$B_2O_3$: 3 to 10 wt %
ZnO: 0 to 8 wt %
$Al_2O_3$: 0 to 3 wt %
$TiO_2$: 0 to 3 wt %
alkali metal oxides selected from the group consisting of $Li_2O$, $Na_2O$, $K_2O$ and a mixture thereof: 0 to 5 wt %
alkaline earth metal oxides selected from the group consisting of MgO, CaO, BaO, SrO and a mixture thereof: 0 to 5 wt %

The content of the glass powder is preferably from 1 to 6 wt %, more preferably from 1.5 to 5.0 wt %, where the paste has a weight of 100 wt %.

c) Organic Solvent

There are no particular limitations on the type of the organic solvent. Examples of the organic solvent include, but are not limited to, α-terpineol, butyl carbitol, butyl carbitol acetate, Texanol, octanol, 2-ethylhexanol, and mineral spirit.

An organic binder may also be added so as to make the organic solvent into a resin solution. Examples of such an organic binder include an ethyl cellulose resin, a hydroxypropyl cellulose resin, an acrylic resin, a polyester resin, a polyvinyl butyral resin, a polyvinyl alcohol resin, a rosin-modified resin, and an epoxy resin.

Furthermore, a dilution solvent may be added to the conductor paste for adjusting the viscosity. Examples of such a dilution solvent include terpineol and butyl carbitol acetate.

d) Glass Softening Point Adjuster

The paste may further contain a glass softening point adjuster. By adding a glass softening point adjuster, the softening point of the glass powder can be reduced. Examples of such a glass softening point adjuster include $Cu_2O_3$, CuO, $P_2O_5$, $SnO_2$, alkali metal halides, and alkaline earth metal halides. Two or more of these may be used in combination.

The glass softening point adjuster content is from 0 to 5 wt % where the paste has a weight of 100 wt %.

e) Other Additives

Thickeners and/or stabilizers and/or other common additives (e.g. sintering aids etc.) may be added to the conductive paste of the present invention. Examples of other common additives include dispersants and viscosity modifiers. The amount of such an additive is determined depending on the properties of the conductor paste ultimately required. The amount of the additive can be determined by a person skilled in the art as appropriate. A plurality of additives may be added.

The ceramic substrate conductor paste of the present invention can be conveniently manufactured by mixing together the various components using a triple roll mill or the like.

Next, the method of the electric circuit forming with the paste on ceramic substrate of the present invention will be described with reference to FIG. 1.

The conductor film formation method of the present invention comprises a step of applying onto a ceramic substrate a conductor paste comprising a) a conductive metal powder comprising a silver powder and a palladium powder, b) a glass powder, and c) an organic solvent, wherein the conductive metal powder has an average particle diameter of not more than 1.2 μm, and the glass powder is a $Bi_2O_3$—$SiO_2$—$B_2O_3$ type glass powder, and the content of the conductive metal powder is in a range of from 60 to 92 wt % based on the weight of the paste, and a step of firing the conductor paste that has been applied onto the ceramic substrate at not more than 650° C.

A ceramic substrate 102 is prepared as shown in FIG. 1A. The material of the ceramic substrate 102 may be AlN, $Al_2O_3$, a mixture of $Al_2O_3$ and glass, SiC, ZrO, crystallized glass, or the like.

Figure 1B:
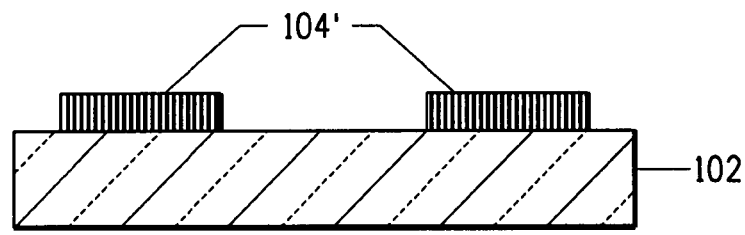

Next, as shown in FIG. 1B, a conductor paste 104' according to the present invention as described above is applied onto the ceramic substrate. The printing may be carried out by screen printing or the like.

Figure 1C:
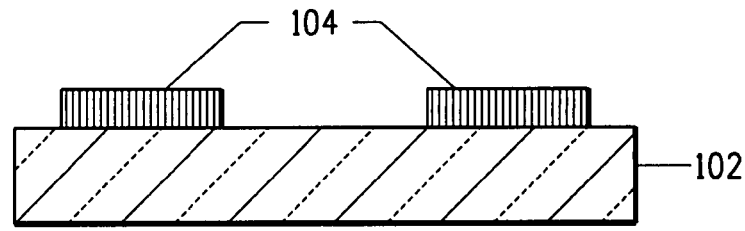

Next, as shown in FIG. 1C, the printed conductor paste is fired, so as to obtain a conductor film 104. The firing is carried out at not more than 650° C., preferably from 480 to 600° C., using an apparatus such as a belt furnace.

The present invention also includes an electric circuit substrate having circuit comprising a conductor film obtained using the above conductor film formation method.

Figure 2:
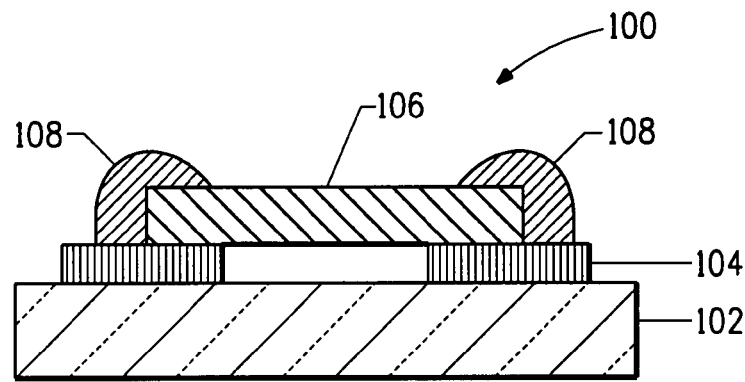
FIG. 2 is a schematic sectional view showing an example of an electric circuit substrate having a circuit comprising the conductor film of the present invention.

The circuit substrate of the present invention has, for example, a structure as shown in FIG. 2. Specifically, the circuit substrate comprises the ceramic substrate 102, circuit comprising the conductor film 104 formed thereon, a chip 106 such as an LCR component, and solder 108 that joins the conductor film 104 and the chip 106 together.

For this circuit substrate, first, a desired chip is mounted on the ceramic substrate 102 having thereon the conductor film 104 which has been obtained using the above conductor film formation method. The mounting of the chip on the ceramic substrate 102 may be carried out using mounting means suitable for the chip. Next, soldering is carried out using a solder (e.g. a lead-free solder of composition Sn/Ag/Cu=95.75/3.5/ 0.75), whereby the conductor film and the chip are connected together, so as to complete the manufacture. For the soldering, a conventional method suitable for the mounted chip may be used. Moreover, instead of an LCR component, an IC package, an LED chip, a filter, an antenna component or the like may be mounted using a similar method.

EXAMPLES

The present invention is now described in more detail through examples; however, the following examples are merely illustrative, and are not intended to limit the present invention.

1. Preparation of Conductor Paste

A conductor paste was prepared in accordance with the compositional ratio for each sample shown in Table 1. Each sample was prepared by weighing the components of the sample out into a container, mixing together using a stirrer, and the dispersing using a triple roll mill.

TABLE 1

| | | | Material compositional proportions (%) | | | |
| --- | --- | --- | --- | --- | --- | --- |
| Paste no. | Silver/ palladium ratio (%) | Average particle diameter of silver powder (μm) | Silver powder | Silver (80%)/ palladium (20%) coprecipitated powder | Glass powder | Resin solution |
| J-1 | Ag:Pd = 95:5 | 0.3 | 63.75 | 21.25 | 1.5 | 13.5 |
| J-2 | Ag:Pd = 98:2 | 1.0 | 76.5 | 8.5 | 1.5 | 13.5 |
| J-3 | Ag:Pd = 95:5 | 0.3 | 63.75 | 21.25 | 3 | 12 |
| J-4 | Ag:Pd = 95:5 | 0.3 | 76.5 | 8.5 | 3 | 12 |
| H-1 | Ag:Pd = 100:0 | 0.3 | 85 | 0 | 0 | 15 |
| H-2 | Ag:Pd = 100:0 | 0.3 | 85 | 0 | 1 | 14 |
| H-3 | Ag:Pd = 100:0 | 0.3 | 85 | 0 | 2 | 13 |
| H-4 | Ag:Pd = 100:0 | 0.3 | 85 | 0 | 3 | 12 |
| H-5 | Ag:Pd = 98:2 | 0.3 | 76.5 | 8.5 | 0.5 | 14.5 |
| H-6 | Ag:Pd = 95:5 | 0.3 | 63.75 | 21.25 | 0.5 | 14.5 |
| H-7 | Ag:Pd = 98:2 | 1.6 | 76.5 | 8.5 | 1.5 | 13.5 |
| H-8 | Ag:Pd = 95:5 | 1.6 | 63.75 | 21.25 | 1.5 | 13.5 |
| H-9 | Ag:Pd = 95:5 | 0.3 | 63.75 | 21.25 | 7 | 8 |
| H-10 | Ag:Pd = 90:10 | 0.3 | 42.5 | 42.5 | 7 | 8 |
| H-11 | Ag:Pd = 95:5 | 1.6 | 63.75 | 21.25 | 7 | 8 |

Resin solution: A solution of an ethyl cellulose resin in butyl carbitol was used.

Glass powder: One of $Bi_2O_3$—$SiO_2$—$B_2O_3$ composition having a glass transition point of 410° C. and a softening point of 450° C. was used.

Silver/palladium co-precipitated powder: A co-precipitated powder of 80 wt % silver and 20 wt % palladium, being a spherical powder of average particle diameter 0.6 μm was used.

2. Formation of Conductor Film

The conductor paste prepared as described above was printed onto an AlN or $Al_2O_3$ substrate using a screen mask (stainless steel, 300 mesh, emulsion thickness 15 μm) such that the thickness after firing would be from 13 to 16 μm.

Next, firing was carried out using a belt furnace under either of two types of firing conditions as follows.

(1) 550° C. firing: for Examples 1 to 5 and Comparative Examples 1 to 11, held for 10 minutes at 550° C., total 30 minute profile.

(2) 600° C. firing: for Examples 3 and 4 and Comparative Examples 1 to 4, held for 10 minutes at 600° C., total 30 minute profile.

The following were used as the AlN and $Al_2O_3$ substrates.

AlN (170 W/mK article) substrate: 1 inch size, thickness 0.6 mm.

$Al_2O_3$ (96%) substrate: 1 inch size, thickness 0.6 mm.

TABLE 2

| Example no. | Paste no. | Substrate | 550° C. firing Initial strength (N) | 600° C. firing Initial strength (N) |
|---|---|---|---|---|
| Example 1 | J-1 | AlN | 24.2 | — |
| Example 2 | J-2 | AlN | 16.1 | — |
| Example 3 | J-3 | AlN | 25 | 27 |
| Example 4 | J-3 | $Al_2O_3$ | 25.1 | 28.3 |
| Example 5 | J-4 | AlN | 23.9 | — |
| Compar. Ex. 1 | H-1 | AlN | 0 | 0 |
| Compar. Ex. 2 | H-2 | AlN | 1.2 | 2.4 |
| Compar. Ex. 3 | H-3 | AlN | 0 | 0 |
| Compar. Ex. 4 | H-4 | AlN | 0 | 0 |
| Compar. Ex. 5 | H-5 | AlN | 0 | — |
| Compar. Ex. 6 | H-6 | AlN | 1.8 | — |
| Compar. Ex. 7 | H-7 | AlN | 4.9 | — |
| Compar. Ex. 8 | H-8 | AlN | 8.8 | — |
| Compar. Ex. 9 | H-9 | AlN | 0 | — |
| Compar. Ex. 10 | H-10 | AlN | 0 | — |
| Compar. Ex. 11 | H-11 | AlN | 2.1 | — |

TABLE 3

| | | | 550° C. firing | | 600° C. firing | |
|---|---|---|---|---|---|---|
| Example no. | Paste no. | Substrate | Strength after aging at high temperature of 150° C. for 500 hours (N) | Strength after 100 theram cycles of −40° C./125° C. (N) | Strength after aging at high temperature of 150° C. for 500 hours (N) | Strength after 100 thermal cycles of −40° C./125° C. (N) |
| Example 3 | J-3 | AlN | 15.5 | 11.3 | 25.6 | — |
| Example 4 | J-3 | $Al_2O_3$ | 17.2 | 16.2 | 22.2 | 21.7 |

Evaluation (A) Adhesive Strength Between AlN or $Al_2O_3$ Substrate and Conductor Film (i) Measurement of Initial Adhesive Strength The conductor film on substrate prepared in each of the Examples was immersed for 10 seconds at 240° C. in a lead-free solder of composition Sn/Ag/Cu=95.75/3.5/0.75. A tin-plated copper wire was attached onto a 2 mm² silver conductor film using the lead-free solder, the copper wire was stood up perpendicular to the substrate, and the initial adhesive strength immediately after the soldering was measured using a tensile tester. The results are shown in Table 2.

(ii) Measurement of Adhesive Strength After Aging at High Temperature, and After Thermal Cycle For the samples of Examples 3 and 4 (samples of two types, i.e. fired at 550° C. or fired at 600° C.) that had been subjected to soldering as described in (i) above, the adhesive strength after leaving for 500 hours at 150° C., and the adhesive strength after 100 thermal cycles of −40° C./125° C. were measured. The results are shown in Table 3.

As can be seen from the above results, a conductor paste of the present invention is lead-free and cadmium-free, can be fired at a low temperature of not more than 650° C., and gives markedly improved adhesive strength between a ceramic substrate and a conductor film. Moreover, it can be seen that for a conductor film produced using a conductor paste of the present invention, sufficient adhesive strength can be maintained even after aging at a high temperature, or after a thermal cycle.

What is claimed:

1. A conductor paste for a ceramic substrate comprising:
   a) a conductive metal powder comprising a mixture of silver powder and palladium powder;
   b) a glass powder; and
   c) an organic solvent, wherein the conductive metal powder has an average particle diameter of not more than 1.2 μm, and the glass powder is a $Bi_2O_3$—$SiO_2$—$B_2O_3$ type of glass powder, and the content of the glass powder is in a range of from 1 to 6 wt % based on the weight of the paste, wherein the content of the palladium powder is in the range of from 0.1 to 7 wt % based on the total weight of the silver and palladium.

2. The conductor paste according to claim 1, wherein the conductive metal powder comprises monodispersed particles.

3. The conductor paste according to claim 1, further comprising, as the conductive metal powder, from 0.1 to 10 wt % of gold or platinum based on the weight of the paste.

4. The conductor paste according to claim 1, wherein the glass powder has a transition point of from 360 to 450° C., and a softening point of from 400 to 530° C.

5. The conductor paste according to claim 1, wherein the glass powder has a composition as follows:
$Bi_2O_3$: 65 to 90 wt %
$SiO_2$: 0.5 to 8 wt %
$B_2O_3$: 3 to 10 wt %
ZnO: 0 to 8 wt %
$Al_2O_3$: 0 to 3 wt %
$TiO_2$: 0 to 3 wt %
alkali metal oxides selected from the group consisting of $Li_2O$, $Na_2O$, $K_2O$ and a mixture thereof: 0 to 5 wt %
alkaline earth metal oxides selected from the group consisting of MgO, CaO, BaO, SrO and a mixture thereof: 0 to 5 wt %.

6. The conductor paste according to claim 1, wherein the content of the conductive metal powder is in a range of from 60 to 92 wt % based on the weight of the paste.

7. The conductor paste according to claim 1, further comprising a glass softening point adjuster selected from the group consisting of $Cu_2O_3$, CuO, $P_2O_5$, $SnO_2$, alkali metal halides, and alkaline earth metal halides.

8. A conductor film formation method comprising steps of: applying onto a ceramic substrate the conductor paste according to claim 1; and firing the conductor paste that has been applied onto the ceramic substrate at not more than 650° C.

9. An electric circuit substrate having a circuit comprising a conductor film obtained using the conductor paste according to claim 1.

* * * * *